United States Patent [19]

Fielding et al.

[11] 4,221,956

[45] Sep. 9, 1980

[54] APPARATUS FOR PRACTICING TEMPERATURE GRADIENT ZONE MELTING

[75] Inventors: John O. Fielding, Ballston Lake; Carl A. Erikson, Schenectady; Thomas R. Anthony, Schenectady; Harvey E. Cline, Schenectady; Siegwalt Ludke, Scotia, all of N.Y.

[73] Assignee: General Electric Company, Schenectady, N.Y.

[21] Appl. No.: 917,493

[22] Filed: Jun. 21, 1978

Related U.S. Application Data

[63] Continuation of Ser. No. 796,367, May 12, 1977, abandoned.

[51] Int. Cl.³ .................... B25J 15/06; F27B 9/06
[52] U.S. Cl. .................... 219/388; 219/354; 219/405; 219/411; 432/120; 432/231
[58] Field of Search .................... 432/227, 86, 87, 121, 432/230, 231, 120; 219/411, 10.69, 405, 10.73, 10.79, 385, 85 G, 85 CA, 85 D, 85 F, 58, 345, 354; 13/20; 214/1 BH, 1 BT; 271/5, 14, 98, 105; 148/171

[56] References Cited

U.S. PATENT DOCUMENTS

| | | | |
|---|---|---|---|
| 2,881,929 | 4/1959 | Griffen | 214/1 BS |
| 3,209,923 | 10/1965 | Bargel et al. | 198/486 |
| 3,476,632 | 11/1969 | Cornelius | 214/1 BS |
| 3,666,907 | 5/1972 | Nugent et al. | 219/85 BA |
| 3,891,205 | 6/1975 | Sunahara et al. | 271/98 |
| 4,002,246 | 1/1977 | Brandt et al. | 214/1 BH |
| 4,097,226 | 6/1978 | Erikson et al. | 219/343 |

FOREIGN PATENT DOCUMENTS 710487  6/1954  United Kingdom .................... 271/26

*Primary Examiner*—Elliot A. Goldberg
*Assistant Examiner*—Bernard Roskoski
*Attorney, Agent, or Firm*—Donald M. Winegar; James C. Davis, Jr.; Leo I. MaLossi

[57] ABSTRACT

An apparatus for practising temperature gradient zone melting simultaneously on a plurality of semiconductor bodies comprises a closable work chamber for receiving the bodies for processing; a heat source disposed in the work chamber and comprising a first closure member thereof; a heat sink disposed in the work chamber and comprising a second closure member thereof and means for transferring one or more bodies of semiconductor material to the work chamber for processing and from the work chamber subsequent to processing. The transferring means comprises manipulative means for selectively engaging the semiconductor bodies and supporting the bodies in transit and drive means for moving the manipulative means toward and away from the work chamber and orienting the manipulative means with respect to the semiconductor bodies.

31 Claims, 4 Drawing Figures

APPARATUS FOR PRACTICING TEMPERATURE GRADIENT ZONE MELTING

CROSS REFERENCES

This is a continuation of application Ser. No. 796,367, filed May 12, 1977, now abandoned.

This invention relates to the following U.S. patent applications assigned to the assignee of the present invention:

Patent application Ser. No. 735,512, filed Oct. 26, 1976, U.S. Pat. No. 4,101,759, in the names of Thomas R. Anthony, Harvey E. Cline, John O. Fielding and Carl A. Erikson, and entitled "Semiconductor Body Heater" which discloses and claims a new and improved heat source for the practice of temperature gradient zone melting;

Patent application Ser. No. 735,513, filed Oct. 26, 1976, U.S. Pat. No. 4,097,226, in the names of Harvey E. Cline, John O. Fielding, Carl A. Erikson and Thomas R. Anthony and entitled "Furnace For Practising Temperature Gradient Zone Melting" which discloses and claims a new and improved apparatus for maintaining a uniform temperature gradient across a plurality of bodies undergoing processing by temperature gradient zone melting and Patent application Ser. No. 796,368, now abandoned, filed the same date as this patent application in the names of Carl A. Erikson, Thomas R. Anthony, Harvey E. Cline, Siegwalt Ludke and John O. Fielding and entitled "Apparatus For Practicing Temperature Gradient Zone Melting" which discloses and claims an apparatus for an automated practice of temperature gradient zone melting.

BACKGROUND OF THE INVENTION

1. Field of the Invention

This invention relates to an apparatus for practising temperature gradient zone melting and more specifically to an apparatus for an automated practise of temperature gradient zone melting.

2. Description of the Prior Art

In the manufacture of semiconductor devices, it is often necessary to alter or tailor the conductivity type of a body of semiconductor material. This alteration is achieved by distributing atoms of a conductivity modifying dopant in a selected region or selected regions of the body. Frequently, techniques employed to achieve that distribution require the heating of the semiconductor body.

Recently, it has been discovered that a preferred technique of altering the conductivity of a semiconductor body is the technique of temperature gradient zone melting. Early teachings of temperature gradient zone melting are found in U.S. Pat. No. 2,813,048 issued to W. G. Pfann and in a book by Pfann entitled *Zone Melting* (John Wiley and Sons, Inc., 1966). More recent applications of temperature gradient zone melting are disclosed and claimed in U.S. Pat. Nos. 3,899,361 and 3,899,362 to Thomas R. Anthony and Harvey E. Cline and assigned to the assignee of the present invention. The aforementioned patents to Anthony and Cline are incorporated herein by reference. As taught in the aforementioned book by Pfann, temperature gradient zone melting involves the migration of a melt of a first material through a body of a second material under the influence of a temperature gradient maintained across the second material and finally a recrystallization of the melt after migration. In the application of temperature gradient zone melting to the production of semiconductor devices, the first material usually comprises a metal such as aluminum, tin-aluminum alloy or gold-antimony alloy while the second material comprises a semiconductor material such as silicon, germanium or the like.

In his copending U.S. patent application Ser. No. 578,736, filed May 19, 1975, U.S. Pat. No. 4,041,278, and entitled "Heating Apparatus For Temperature Gradient Zone Melting" John Boah discloses a furnace suitable for the manufacture of semiconductor devices by temperature gradient zone melting. However, it was found that the Boah apparatus could be improved upon in a number of respects. A new and improved heater useful in such a furnace is disclosed and claimed in the aforementioned U.S. Pat. No. 4,101,759 incorporated herein by reference. This heater provides a heat output capability commensurate with a large scale commercial manufacture of semiconductor devices, the temperature gradient across an array of semiconductor devices heated by this heater being of a uniformity sufficient to ensure consistency in the simultaneous production of a plurality of semiconductor devices.

Another furnace suitable for processing semiconductor bodies by temperature gradient zone melting is disclosed and claimed in U.S. Pat. No. 4,097,226 previously cited and incorporated herein by reference. This furnace is particularly well suited for a large scale manufacture of semiconductor devices by temperature gradient zone melting due to its simplicity of construction, potential for accommodating a large number of semiconductor bodies simultaneously and the accessibility of the work chamber or interior of the furnace by automated loading and unloading apparatus.

Large scale commercial manufacture of semiconductor devices necessarily requires automated apparatus for the transfer of semiconductor bodies from one work station to a successive station. Therefore, such a commercial manufacture of semiconductor devices by temperature gradient zone melting, requires automated apparatus for the loading of semiconductor wafers into the furnace and the removal of semiconductor wafers from the furnace. To optimize the processing such a loading and unloading should be accomplished as rapidly and simply as possible.

The semiconductor wafers, before being loaded into the furnace, have undergone considerable processing which may include, among others, the processing steps of selective coating, metallization, impurity introduction selective removal of surface materials and clearing operations, each process adding to the value of the unheated wafers. The wafers are generally quite brittle and of a typical thickness of only 6 to 12 mils making the wafers quite fragile. Therefore, any apparatus for the automated loading of wafers into a furnace and unloading from a furnace must carry out these functions without damaging the valuable yet fragile wafers.

Accordingly, it is an object of the present invention to provide an apparatus for practising temperature gradient zone melting which overcomes the deficiencies of the prior art.

It is another object of the present invention to provide an apparatus for the practise of temperature gradient zone melting wherein semiconductor wafers are loaded into and unloaded from a furnace in a simple manner requiring a minimal amount of time.

It is another object of the present invention to provide an apparatus for the practise of temperature gradient zone melting wherein semiconductor wafers are loaded into and unloaded from a furnace with only minimal risk of damaging the wafers.

SUMMARY OF THE INVENTION

These and other objects apparent from the following detailed description taken in connection with the appended claims and accompanying drawings are attained by providing an apparatus for practising temperature gradient zone melting simultaneously on a plurality of semiconductor bodies which apparatus includes a closable work chamber for receiving the bodies for processing; a heat source disposed in the work chamber and comprising a first closure member thereof and a heat sink disposed in the work chamber and comprising a second closure member thereof. The closure members are mutually separable by a first actuator such as, for example, an hydraulic actuator. The apparatus also includes a means for transferring one or more bodies of semiconductor material to the work chamber for processing and from the work chamber subsequent to processing. The transferring means comprises manipulative means for selectively engaging the semiconductor bodies and supporting the bodies in transit and drive means for moving the manipulative means toward and away from the work chamber and orienting the manipulative means with respect to the semiconductor bodies and other work stations. The manipulative means comprises a plurality of vacuum lines of attaching to an equal number of semiconductor bodies by suction and an actuator for bringing the vacuum lines into contact with the semiconductor bodies. The drive means comprises a carriage upon which the manipulative means are supported and an electric drive for propelling the carriage along a track extending approximately from the work chamber. Other work stations or means for storing the semiconductor bodies prior to processing and for receiving the semiconductor bodies subsequent to processing are also disclosed. The storing means includes a series of gas jet nozzles for separating adjacent semiconductor bodies within a single stack thereof to ensure that the manipulative means removes only one body at a time from the stack.

DESCRIPTION OF THE PREFERRED EMBODIMENT

Figure 1:
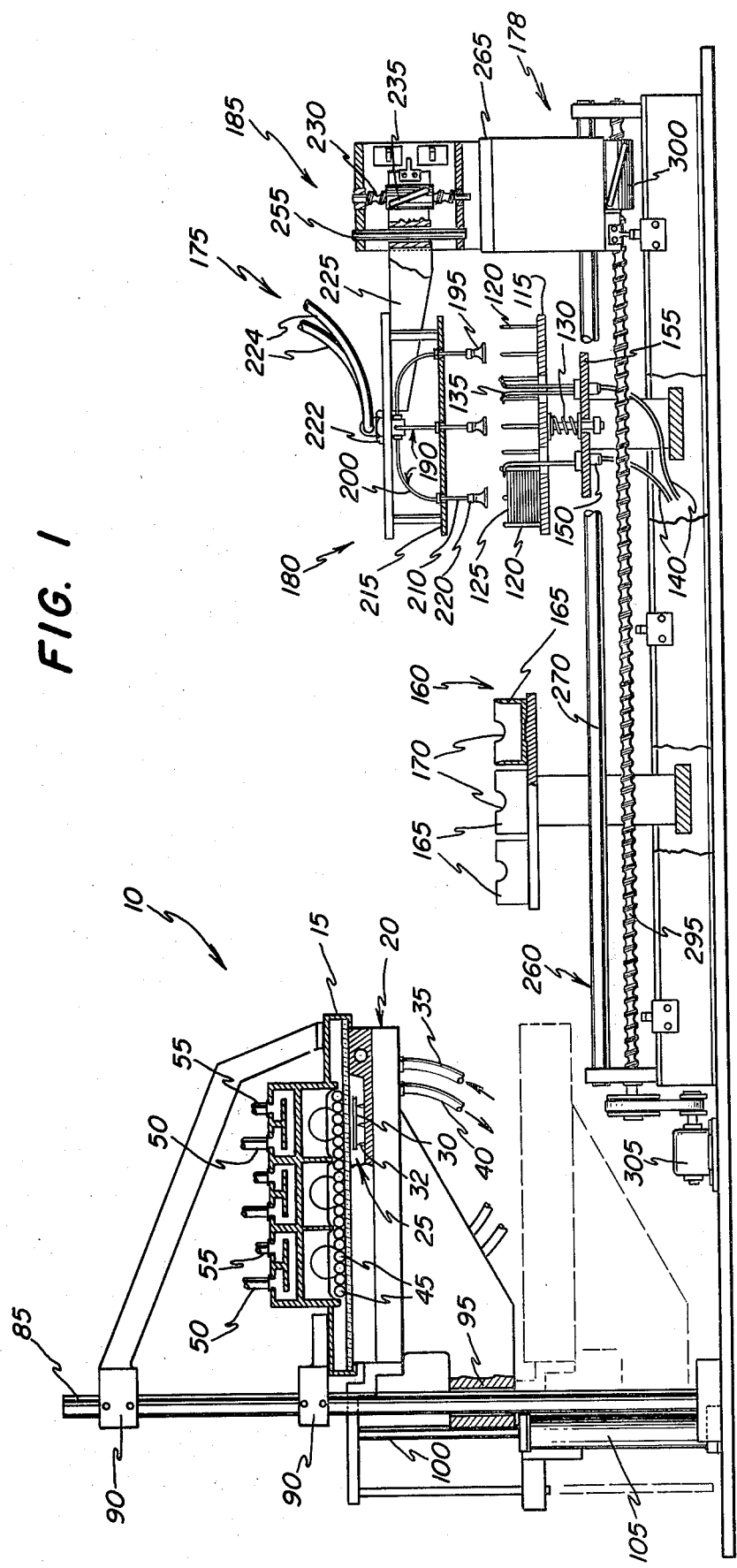
FIG. 1 is a side view partially sectioned and broken away of the apparatus of the present invention.
Figure 2:
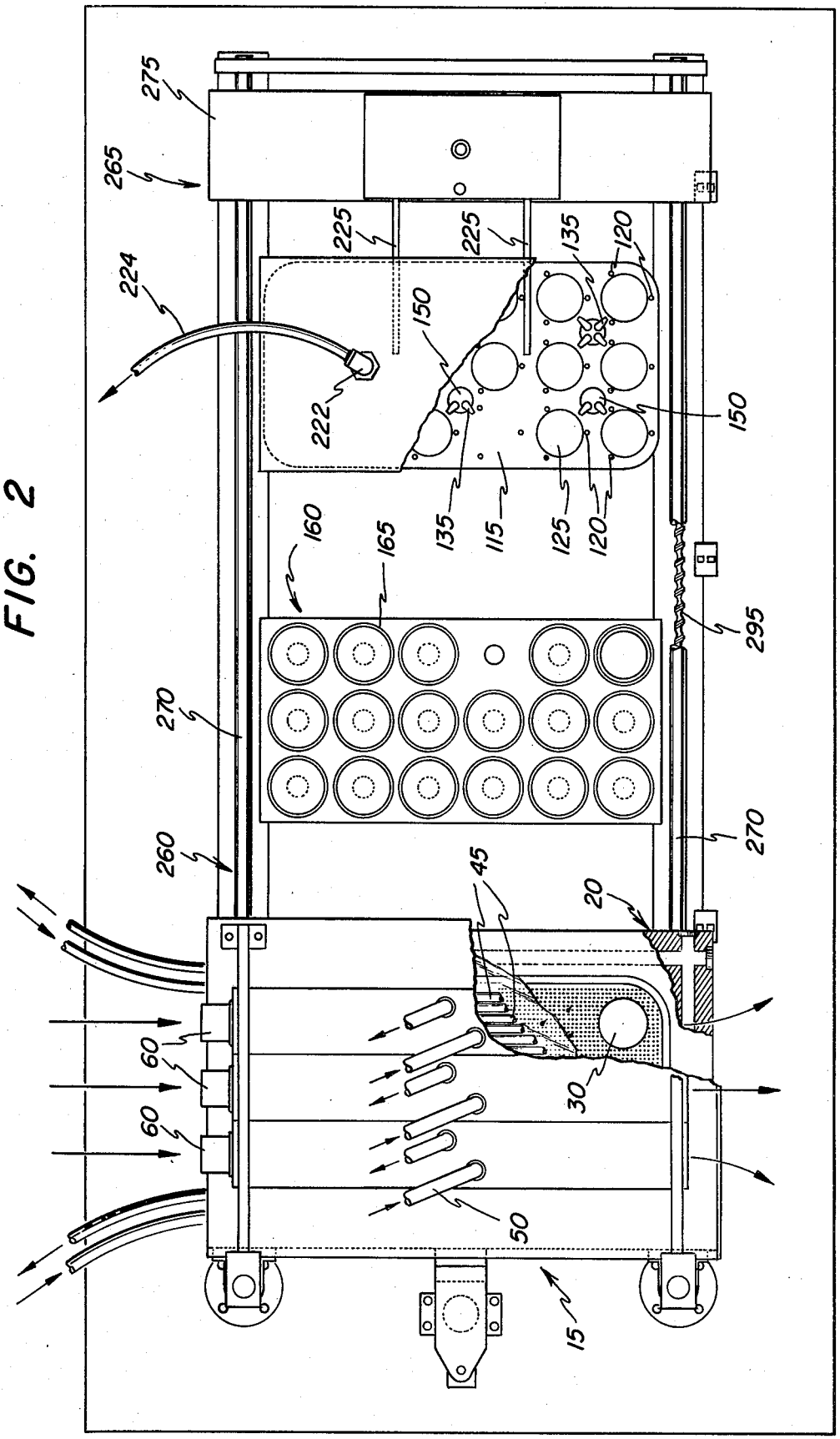
FIG. 2 is a top view partially sectioned and broken away of the apparatus of the present invention.

Referring to the drawings there is shown a new and improved apparatus 10 for practising temperature gradient zone melting. Apparatus 10 includes a heat source or first closure member 15 and a heat sink or second closure member 20 which define in part a closable work station chamber 25 which receives semiconductor bodies or wafers 30 for the processing thereof by temperature gradient zone melting. Wafers 30 are disposed on supports 32 within work chamber 25. Heat sink 20 is internally cooled by a flow of coolant therethrough, the coolant being supplied to the heat sink through pipe 35 and drained from the heat sink through pipe 40. Heat source 15 comprises a plurality of radiative heating elements 45 which in the preferred embodiment comprises tungsten filament quartz halogen lamps which upon proper energization emit infrared radiation of a temperature as great as 3000° C. Heat source 15 is cooled by a flow of liquid coolant supplied thereto through pipes 50 and drained therefrom through pipes 55. The heat source is also cooled by a flow of coolant gas over the lamp envelopes, the coolant gas being supplied to the heat source through supply tubes 60. In the preferred embodiment, the coolant gas comprises compressed air which is pressurized by a blower (not shown). Heat source 15 is fixed to upstanding rails 85 at locations 90. Heat sink 20 includes bearings 95 in which rails 85 are slidably received. Heat sink 20 is fixed to a piston rod 100 of a suitable actuator 105, the actuator providing movement of heat sink 20 on rails 85 to effect the opening and closing of work chamber 25. It has been found that actuators of the hydraulic, pneumatic or hydro-pneumatic variety are particularly well suited for this application. Details of construction of the heat source and heat sink are found in the aforementioned U.S. Pat. Nos. 4,101,759 and 4,097,226 and form no part of the present invention.

Means are also provided for storing semiconductor bodies 30 prior to the transfer of the bodies to work chamber 25. This station comprises supporting base 115 having a plurality of guides 120 extending from a major surface thereof, the guides serving to maintain the alignment of stacks 125 of semiconductor bodies 30. Base 115 is biased upwardly toward stacks 125 of semiconductor by a spring 130. In the preferred embodiment supporting base 115 supports an array of eighteen stacks of semiconductor wafers. Therefore, as will be described hereinafter, an array of eighteen semiconductor wafers is transferred to working chamber 25 at once. However, this number of stacks of semiconductor wafers is shown for illustrative purposes only and more or less of such stacks may be used as required.

As will be shown hereinafter, the apparatus of the present invention is provided with means for transferring a single semiconductor wafer from each of stacks 125 to work chamber 25 at one time. To ensure that only one wafer is transferred from each stack, i.e., to prevent the top two wafers from sticking together, means for separating the semiconductor wafers from each other while stacked are provided and comprise at least one gas nozzle 135 disposed in proximity to each of stacks 125, the gas nozzles directing a jet of air at the top two or more semiconductor wafers in a stack to separate the top two or more wafers as the top wafer is lifted from the stack in its transferral to work chamber 25. In the preferred embodiment, compressed air is supplied to nozzles 135 from pipes 140 adapted for commmunication with a suitable source of compressed air (not shown). Each of pipes 140 supplies compressed air to a plurality of nozzles 135 through at least one manifold 150 each of the manifolds 150 being fixed to a stationary support member 155 disposed adjacent to a side of supporting base 115 opposite that on which the stacked array of semiconductor wafers is supported.

Means are provided for receiving semiconductor wafers after processing in work chamber 25. These receiving means or station 160 comprise cylindrical cups 165 adapted to receive a stack of semiconductor wafers. Each cup is slotted at diametrically opposed locations 170 in the lateral surface thereof.

To provide for the rapid loading and unloading of work chamber 25 in a manner minimizing risks of damage to the semiconductor wafers, the apparatus of the present invention is provided with a transferring means comprising a manipulative means 175 for selectively engaging and supporting the semiconductor wafers in transit and drive means 178 for moving the manipulative means toward and away from work chamber 25 and orienting the manipulative means with respect to the semiconductor wafers and the other work stations. Manipulative means 175 comprises means 180 for selectively attaching to the semiconductor wafers and a second actuator for 185 for placing the attaching means in contact with the semiconductor wafers. The attaching means 180 comprises at least one vacuum line 190 adapted for communication with a vacuum source. A single semiconductor wafer is engageable and supported by a vacuum line at one end thereof through suction. Each of vacuum lines 190 terminates in a vacuum cup 195 at the end of the line engageable by the semiconductor wafer. Each vacuum line further comprises a flexible portion 200 and a rigid end portion 210 slidably received within a vacuum line guide 215. Each of the vacuum cups are fixed to and communicate with the rigid end portion and are biased toward stacks 125 of semiconductor wafers by weights 220. A vacuum is applied to a plurality of lines 190 through manifolds 222 and vacuum tubes 224. The vacuum line guide 215 is fixed to bracket 225 which in turn is driven by a second actuator 185.

Figure 3:
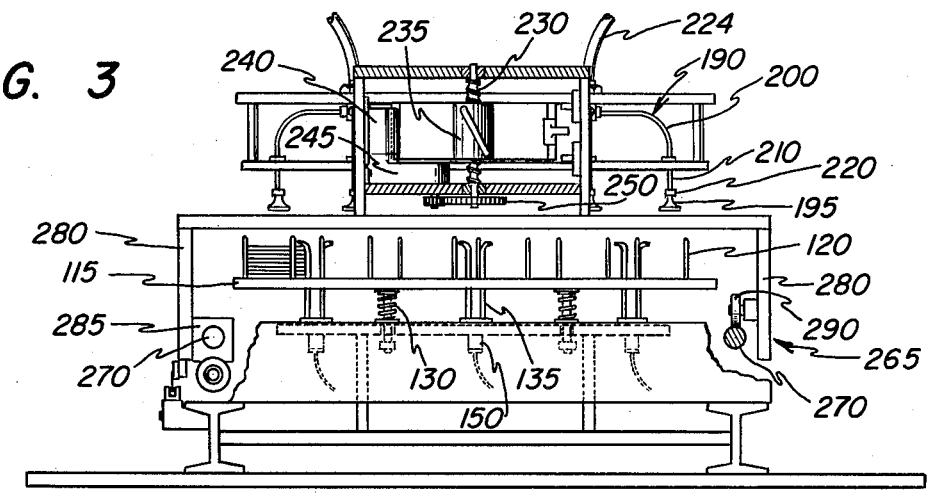
FIG. 3 is an end view partially sectioned and broken away of the apparatus of the present invention.
Figure 4:
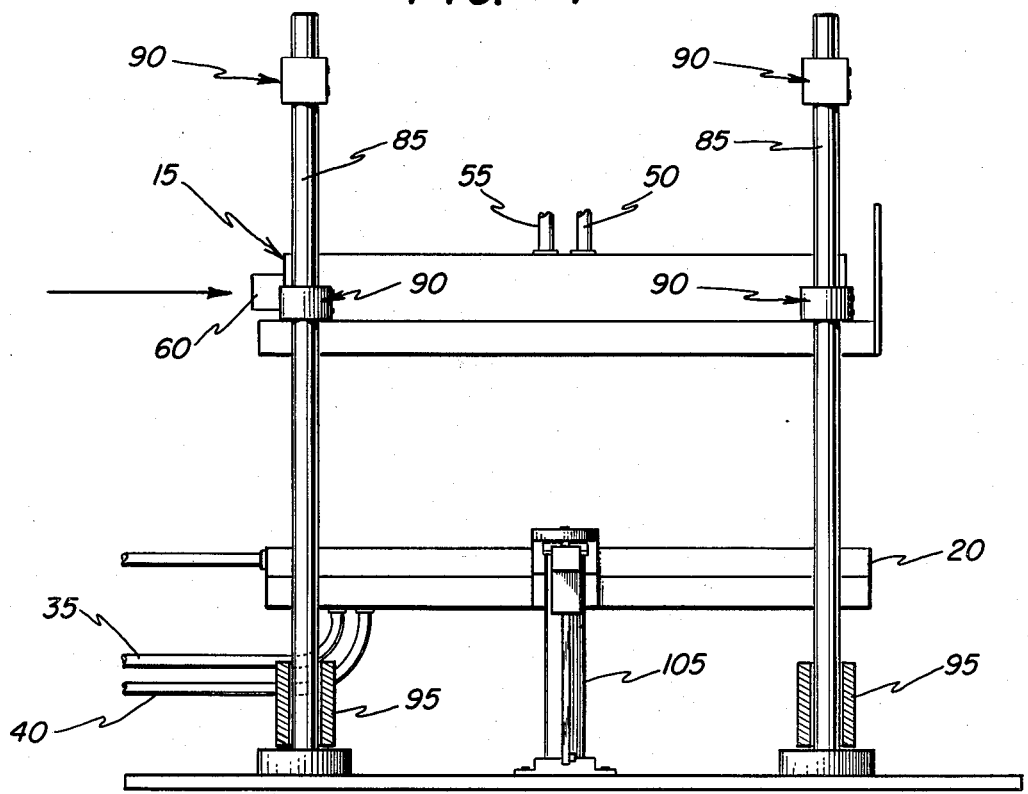
FIG. 4 is an end view partially sectioned and broken away of an opposite end of the apparatus from that shown in FIG. 3 with means for transferring semiconductor bodies to and from a work chamber removed for clarity.

Second actuator 185 comprises a drive screw 230 and a driven nut 235 fixed to attaching means 180 through bracket 225 and engageable and driven by the drive screw. A suitable drive screw and driven nut are a ball screw and mating ball nut marketed by Warner Electric Brake and Clutch Company of Belloit, Wis. An electric motor 240 drives drive screw 230 through gear box 245 and gear set 250 (see FIG. 3). Second actuator 185 also includes a guide 255 which maintains the alignment of bracket 225 with the drive screw and driven nut. Guide 255 comprises a straight rod disposed parallel to the drive screw, bracket 225 being bored to slidably receive the guide.

Drive means 178 comprises a track 260 extending approximately from work chamber 25, a carriage 265 which supports manipulative means 175 and is movably supported on track 260 and means for propelling the carriage along the track. Track 260 comprises first and second generally parallel rails 270. Carriage 265 comprises a bridging member including a central portion 275 which supports the manipulative means and first and second generally parallel legs 280 which extend from opposite ends of the central portion. Each of first and second legs 280 engage one of rails 270, one through a pillow block 285 in which one of rails 270 is slidably received and the other through a roller bearing 290 which is rotatable upon the other rail. Carriage 265 moves along track 260 by a propelling means which comprises a drive screw 295 disposed generally parallel to track 260 and a driven nut 300 fixed to carriage 265 and engageable and driven by the drive screw. Drive screw 295 and driven nut 300 may be of the aforementioned variety marketed by Warner Electric Brake and Clutch Company. Drive screw 295 is powered by a second electric motor 305.

Operation

Attaching means 180 is brought into contact with the uppermost semiconductor wafer of each stack 125 by electric motor 240 turning drive screw 230 and driven nut 235. A vacuum applied to each of vacuum cups 195 causes the top semiconductor wafer of each stack to become attached to a corresponding vacuum cup. The attaching means is then raised by electric motor 240 and carriage 265 is driven toward work chamber 225 by electric motor 305 turning drive screw 295 and driven nut 300. Attaching means 180 is moved into the interior of open work chamber 25 wherein the attaching means is lowered so that each semiconductor wafer is made to rest gently on a plurality of supports 32. The vacuum is then removed from cups 195 and attaching means 180 is raised out of engagement with the semiconductor wafers. Electric motor 305 then drives carriage 265 moving attaching means 180 out of the interior of work chamber 25. First actuator 105 closes work chamber 25 and the semiconductor wafers are processed by temperature gradient zone melting. After processing, first actuator 105 opens work chamber 25 and electric motor 305 drives carriage 165 toward the work chamber moving attaching means 180 into the interior of the work chamber. Attaching means 180 is then lowered by electric motor 240 so that vacuum cups 195 engage the semiconductor wafers. A vacuum is applied to the vacuum cups and the attaching means is raised slightly by electric motor 240 lifting the wafers off of their supports. Carriage 265 is then driven out of the work chamber by electric motor 305 to a position just above the semiconductor body receiving means 160. Attaching means 180 is then lowered by electric motor 240 and the vacuum is removed allowing the processed semiconductor wafers to be gently deposited within cups 165. Attaching means 180 is then lifted out of the cups by electric motor 240 and carriage 265 is returned to a position over the semiconductor stacks 125 to begin a new cycle.

It can be seen then that the apparatus of the present invention provides a means by which semiconductor wafers may be loaded rapidly into and unloaded from a temperature gradient zone melting furnace for the large scale commercial manufacture of semiconductor devices. The wafers are moved in the loading and unloading operations in a manner minimizing the risks of damage thereto.

The functioning of the apparatus of this invention is adaptable for control by a logic circuit means or system 400 such, for example, as one or more large scale integrated circuits or a microprocessor. Such a logic system embodies a monitoring system for detecting the presence or absence of heat, cooling water, vacuum, cooling air and air for separating the wafers for loading. In particular, the logical system controls the power to the heat source in order to provide a predetermined time-temperature profile for processing the wafers in the apparatus. This enables one to optimize the wafer yield and wafer throughput to minimize process costs and to maximize the conservation of energy. Other detecting systems can be embodied in such a logic system for sensing the operative state of the power supply, transfer means, oven, wafer supply, and the like. The logic system is also employed to control the operating sequence of the furnace apparatus and to initiate an alarm signal to alert the operator whenever a faulty operating condition is detected and to automatically terminate furnace operation safely in a preplanned sequence operation without damage to the furnace components and to achieve the highest possible processed wafer yields.

While there has been shown and described one embodiment of the apparatus of the present invention it will be apparent to those skilled in the art that modifications may be made without departing from the substance of the invention and it is intended by the appended claims to cover such modifications as come within the spirit and scope of this invention.

We claim as our invention:

1. Apparatus for the processing of one or more bodies of semiconductor material by temperature gradient zone melting, said apparatus including:
    (a) a closable work chamber in which the temperature gradient zone melting process is practiced, said closable work chamber comprising a first closure member having a heat source therein and a second closure member having a heat sink therein;
    (b) means disposed in said work chamber for supporting said bodies of semiconductor material therein;
    (c) a first actuator means for providing relative movement between said first and said second closure members to effect the opening and the closing of said work chamber;
    (d) said heat source facing internally of said work chamber and comprising radiative heating elements for heating said bodies of semiconductor material;
    (e) the heat sink cooperating with said heat source to produce a relatively uniform temperature gradient within said bodies of semiconductor material during processing;
    (f) first means for storing a plurality of bodies of semiconductor bodies prior to the transfer of said bodies to said closable work chamber;
    (g) second means for storing a plurality of bodies of semiconductor bodies after the transfer of said bodies from said closable work chamber;
    (h) manipulative means for selectively engaging and supporting a plurality of bodies of semiconductor material in transit from said first storage means to said closable work chamber, and from said closable work chamber to said second storage means;
    (i) drive means for moving said manipulative means to and from said first storage means, said second storage means and said said closable work chamber, and
    (j) means for operating said manipulative means for engaging and releasing a plurality of bodies of semiconductor material,
    (k) said manipulative means comprising
        (1) means including at least one vacuum line adapted for communication with a vacuum source for selectively attaching to said bodies of semiconductor material, a single one of said bodies of semiconductor material being engageable and supportable by said vacuum line at one end thereof through suction, and
        (2) a second actuator for placing said attaching means in contact with said bodies of semiconductor material, said single one of said bodies of semiconductor material being supported at said end of said vacuum line by application of a vacuum to the said vacuum line, and said single one of said bodies of semiconductor material being released from said end of said vacuum line by removal of the vacuum from said vacuum line.

2. The apparatus of claim 1 wherein said second storage means comprises at least one open cylindrical cup adapted to receive a stacked array of said bodies of semiconductor material.

3. The apparatus of claim 1 wherein said first storage means comprises at least one open cylindrical cup adapted to receive a stacked array of said bodies of semiconductor material.

4. The apparatus of claim 3 wherein said cylindrical cup is slotted at diametrically opposed locations in the lateral surface thereof.

5. The apparatus of claim 1 wherein said first closure member is stationary, and said second closure member is movable by said first actuator into and out of closing engagement with said first closure member.

6. The apparatus of claim 1 wherein said first actuator comprises a hydraulic actuator.

7. The apparatus of claim 1 wherein said first actuator comprises a pneumatic actuator.

8. The apparatus of claim 1 wherein said first actuator comprises a hydro-pneumatic actuator.

9. The apparatus of claim 1 wherein said radiative heat source emits radiation of a temperature as high as 3000° C.

10. The apparatus of claim 9 wherein said radiative heat source comprises a plurality of lamps emitting radiation of a peak wavelength greater than 0.8 microns.

11. The apparatus of claim 1 wherein said heat sink comprises a substantially flat plate cooled by a flow of liquid coolant therethrough.

12. The apparatus of claim 1 wherein each of said vacuum lines terminates in a vacuum cup at said end engageable with said semiconductor bodies.

13. The apparatus of claim 12 wherein each of said vacuum lines comprises
    (a) a flexible portion in communication with said vacuum source, and
    (b) a rigid end portion slidably received within a vacuum line guide, said vacuum line guide being movable by said second actuation means, and each of said vacuum cups being fixed to and communicating with said rigid end portion and biased toward the position occupied by a corresponding body of semiconductor material prior to its engagement with said vacuum cup.

14. The apparatus of claim 13 wherein each of said vacuum cups is biased downwardly by a weight.

15. The apparatus of claim 13 and further including a manifold adapted for applying a vacuum to each of a plurality of said vacuum lines, each of said vacuum lines being in fluid communication with said manifold.

16. The apparatus of claim 15 wherein said manifold is fixed to a manifold support movable with said vacuum line guide by said second actuator.

17. The apparatus of claim 1 wherein said second actuator comprises
    (a) a drive screw, and (b) a driven nut fixed to said attaching means, said driven nut being engageable and driven by said drive screw.

18. The apparatus of claim 17 and further including a first electric motor in driving engagement with said drive screw.

19. The apparatus of claim 17 and further including a bracket,
said driven nut being operatively connected to said attaching means through said bracket, and
a guide engageable by said bracket, and
said guide maintaining the alignment of said bracket with said drive screw and said driven nut.

20. The apparatus of claim 19 wherein
said guide is a straight rod disposed generally parallel to said drive screw, and
said bracket being bored to slidably receive said straight rod.

21. The apparatus of claim 1 wherein said drive means comprises
(a) a track extending approximately from said work chamber;
(b) a carriage adapted to support said manipulative means, said carriage being movably supported on said track, and
(c) means for propelling said carriage along said track.

22. The apparatus of claim 21 wherein
said track comprises first and second generally parallel rails, and
said carriage comprises a bridging member, said bridging member including a central portion for supporting said manipulative means and having first and second generally parallel legs extending from opposed ends of said central portion, each of said first and second legs movably engaging said first and second rails respectively.

23. The apparatus of claim 21 wherein said propelling means comprises
(a) a drive screw disposed generally parallel to said track, and
(b) a driven nut fixed to said carriage, said driven nut being engageable and driven by said drive screw.

24. The apparatus of claim 23 wherein
said drive screw is powered by a second electric motor.

25. The apparatus of claim 22 and further including
a pillow block fixed to said first leg of said central portion of said bridge member,
said first rail of said track being slidably received within said pillow block, and
a roller bearing rotatably mounted on said second leg of said central portion of said bridge member, said roller beraing being rotatable about said second rail, wherein
said pillow block cooperating with said roller bearing to support said bridging member upon said first and second rails.

26. The apparatus of claim 1 wherein
said first storing means includes a supporting base having a plurality of guides extending from the surface thereof, and
said guides serving to maintain the alignment of one or more stacked arrays of semiconductor bodies.

27. The apparatus of claim 26 wherein
said supporting base is biased toward said bodies of semiconductor material.

28. The apparatus of claim 26 and further including
means for separating said semiconductor bodies from each other, said separating means ensuring that said transferring means removes only a single semiconductor body at any one time from each of said stacks to transfer to said work chamber.

29. The apparatus of claim 28 wherein
said separating means comprises at least one gas nozzle disposed in proximity to each of said stacked arrays of semiconductor bodies and adapted for communication with a source of pressurized gas, said gas nozzles being further adapted for directing a jet of gas at two or more bodies of semiconductor material to cause the bodies to be movable from a single stack of said stacked arrays by said transferring means.

30. The apparatus of claim 29 wherein
a plurality of said gas nozzles communicate with said pressurized gas source through at least one manifold.

31. The apparatus of claim 30 wherein
each of said manifolds is fixed to a stationary support member disposed adjacent to a side of said supporting base opposite that on which said stacked array of semiconductor bodies is supported.

* * * * *